US011871682B2

(12) United States Patent
Nanba et al.

(10) Patent No.: US 11,871,682 B2
(45) Date of Patent: Jan. 9, 2024

(54) QUANTUM DEVICE AND METHOD OF MANUFACTURING THE SAME

(71) Applicant: NEC Corporation, Tokyo (JP)

(72) Inventors: Kenji Nanba, Tokyo (JP); Ayami Yamaguchi, Tokyo (JP); Akira Miyata, Tokyo (JP); Katsumi Kikuchi, Tokyo (JP); Suguru Watanabe, Tokyo (JP); Takanori Nishi, Tokyo (JP); Hideyuki Satou, Tokyo (JP)

(73) Assignee: NEC CORPORATION, Tokyo (JP)

( * ) Notice: Subject to any disclaimer, the term of this patent is extended or adjusted under 35 U.S.C. 154(b) by 195 days.

(21) Appl. No.: 17/349,180

(22) Filed: Jun. 16, 2021

(65) Prior Publication Data

US 2021/0399193 A1 Dec. 23, 2021

(30) Foreign Application Priority Data

Jun. 19, 2020 (JP) .................. 2020-106151

(51) Int. Cl.
*H10N 60/81* (2023.01)
*H01L 23/498* (2006.01)
*H01L 23/34* (2006.01)
*H10N 60/01* (2023.01)
*G06N 10/00* (2022.01)

(52) U.S. Cl.
CPC ............ *H10N 60/81* (2023.02); *H01L 23/34* (2013.01); *H01L 23/49822* (2013.01); *H01L 23/49838* (2013.01); *H10N 60/01* (2023.02); *G06N 10/00* (2019.01); *H01L 23/49827* (2013.01); *H01L 23/49888* (2013.01)

(58) Field of Classification Search
None
See application file for complete search history.

(56) References Cited

U.S. PATENT DOCUMENTS

| | | | |
|---|---|---|---|
| 2006/0027921 A1* | 2/2006 | Chiu | H01L 23/4006 257/E23.084 |
| 2007/0045798 A1* | 3/2007 | Horie | H01L 23/3675 257/E23.193 |
| 2007/0232090 A1* | 10/2007 | Colgan | H01L 23/49838 257/E23.068 |
| 2010/0308451 A1* | 12/2010 | Kodani | H05K 1/09 257/E23.068 |
| 2011/0018114 A1* | 1/2011 | Pagaila | H01L 24/97 257/E23.101 |
| 2011/0278717 A1* | 11/2011 | Pagaila | H01L 23/3677 257/E23.101 |
| 2012/0168930 A1* | 7/2012 | Sato | H01L 23/3675 257/E23.08 |

(Continued)

FOREIGN PATENT DOCUMENTS

WO 2018/212041 A1 11/2018

*Primary Examiner* — Scott B Geyer

(57) ABSTRACT

A quantum device (100) includes: an interposer (112); a quantum chip (111); a first connection part (130) that is provided between the interposer (112) and the quantum chip (111) and electrically connects a wiring layer of the interposer (112) to a wiring layer of the quantum chip (111); and a second connection part (140) that is provided on a main surface of the interposer (112) where the first connection part (130) is arranged and is connected to a cooling plate (115).

6 Claims, 6 Drawing Sheets

(56) References Cited

U.S. PATENT DOCUMENTS

| | | | | |
|---|---|---|---|---|
| 2012/0187578 A1* | 7/2012 | Li | H01L 23/49827 | |
| | | | 257/778 | |
| 2012/0241942 A1* | 9/2012 | Ihara | H01L 23/552 | |
| | | | 438/122 | |
| 2013/0082365 A1* | 4/2013 | Bernier | H01L 23/49816 | |
| | | | 257/659 | |
| 2013/0093074 A1* | 4/2013 | Grant | H01L 25/0655 | |
| | | | 257/713 | |
| 2013/0270691 A1* | 10/2013 | Mallik | H01L 23/34 | |
| | | | 257/713 | |
| 2013/0277821 A1* | 10/2013 | Lundberg | H01L 23/36 | |
| | | | 257/713 | |
| 2014/0264339 A1* | 9/2014 | Kim | F25B 21/02 | |
| | | | 62/3.7 | |
| 2015/0061104 A1* | 3/2015 | Takahashi | H01L 24/74 | |
| | | | 257/704 | |
| 2015/0115433 A1* | 4/2015 | Lin | H01L 24/81 | |
| | | | 438/122 | |
| 2015/0179607 A1* | 6/2015 | Ho | H01L 25/0655 | |
| | | | 438/118 | |
| 2015/0262972 A1* | 9/2015 | Katkar | H01L 22/32 | |
| | | | 438/107 | |
| 2016/0293513 A1* | 10/2016 | Hiruta | H01L 23/3128 | |
| 2017/0271233 A1* | 9/2017 | Imai | H01L 23/49816 | |
| 2018/0254252 A1* | 9/2018 | Nakagawa | H01L 23/50 | |
| 2018/0269188 A1* | 9/2018 | Yu | H01L 23/3128 | |
| 2019/0067157 A1* | 2/2019 | Lin | H01L 21/78 | |
| 2019/0181079 A1* | 6/2019 | Lakhera | H01L 25/0652 | |
| 2019/0273030 A1* | 9/2019 | Lim | H01L 23/3675 | |
| 2019/0318990 A1* | 10/2019 | Nakagawa | H01L 24/17 | |
| 2019/0378777 A1* | 12/2019 | Liao | H01L 23/50 | |
| 2019/0393142 A1* | 12/2019 | Collins | H01L 23/5383 | |
| 2020/0006196 A1* | 1/2020 | Lin | H01L 23/3675 | |
| 2020/0135692 A1* | 4/2020 | Chen | H01L 24/73 | |
| 2020/0152540 A1* | 5/2020 | Nah | H01L 24/32 | |
| 2020/0235027 A1* | 7/2020 | Nah | H01L 21/6835 | |
| 2020/0259064 A1* | 8/2020 | Lewandowski | G06N 10/00 | |
| 2020/0381362 A1* | 12/2020 | Tseng | H01L 21/6835 | |
| 2022/0069532 A1* | 3/2022 | Mohammad | H01L 23/32 | |
| 2022/0367210 A1* | 11/2022 | Lin | H01L 24/73 | |
| 2022/0384306 A1* | 12/2022 | Tang | H01L 24/32 | |

\* cited by examiner

QUANTUM DEVICE AND METHOD OF MANUFACTURING THE SAME

INCORPORATION BY REFERENCE

This application is based upon and claims the benefit of priority from Japanese patent application No. 2020-106151, filed on Jun. 19, 2020, the disclosure of which is incorporated herein in its entirety by reference.

TECHNICAL FIELD

The present disclosure relates to a quantum device and a method of manufacturing the same.

BACKGROUND ART

A quantum device formed of a superconducting material is mounted on a quantum computer device. This quantum device is placed in a cryogenic environment, whereby this quantum device is able to achieve operations that utilize superconducting phenomena. The cryogenic temperature indicates, for example, about 9 K when niobium (Nb) is used and about 1.2 K when aluminum (Al) is used.

A technique that relates to a quantum device is disclosed, for example, in International Patent Publication No. WO 2018/212041. In the quantum bit device (quantum device) disclosed in International Patent Publication No. WO 2018/212041, an interposer substrate is arranged on a base substrate and a quantum bit substrate (quantum chip) is arranged on the interposer substrate. The interposer substrate is flip-chip connected to the quantum bit substrate.

Since one main surface of the interposer is covered with the base substrate in the configuration disclosed in International Patent Publication No. WO 2018/212041, signal lines (terminals) in the quantum bit substrate can be drawn out only from an area of the other main surface of the interposer substrate other than the area where the quantum chip is mounted. That is, in the configuration disclosed in International Patent Publication No. WO 2018/212041, there is a problem that the number of terminals that can be externally drawn out from the quantum bit substrate is small.

SUMMARY

An object of the present disclosure is to provide a quantum device and a method of manufacturing the same that solve the aforementioned problem.

According to one example embodiment, a quantum device includes: an interposer; a quantum chip; a first connection part that is provided between the interposer and the quantum chip and electrically connects a wiring layer of the interposer to a wiring layer of the quantum chip; and a second connection part that is provided on a main surface of the interposer where the first connection part is arranged and is connected to a cooling plate.

According to one example embodiment, a method of manufacturing a quantum device includes: providing a first connection part and a second connection part on one main surface of an interposer; arranging a quantum chip on one main surface of the interposer in such a way that a wiring layer of the quantum chip contacts the first connection part; and arranging a cooling plate on one main surface of the interposer in such a way that the cooling plate contacts the second connection part.

BRIEF DESCRIPTION OF DRAWINGS

The above and other aspects, features and advantages of the present disclosure will become more apparent from the following description of certain exemplary embodiments when taken in conjunction with the accompanying drawings, in which.

EMBODIMENTS

Figure 1:
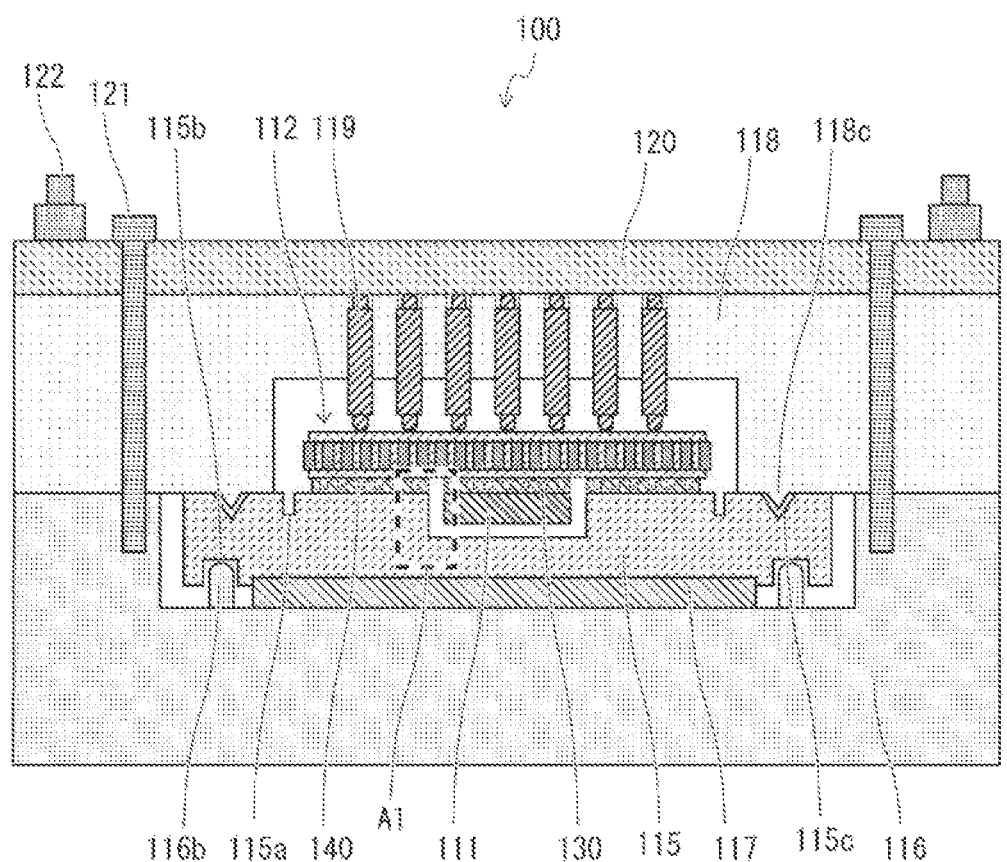
FIG. 1 is a schematic cross-sectional view of a quantum device according to a first example embodiment.

Example embodiments of the present invention will be described below with reference to the accompanying drawings. Note that the drawings are in simplified form and the technical scope of the example embodiments should not be interpreted to be limited to the drawings. The same elements are denoted by the same reference numerals and a duplicate description is omitted.

In the following example embodiments, when necessary, the present invention is explained by using separate sections or separate example embodiments. However, those example embodiments are not unrelated with each other, unless otherwise specified. That is, they are related in such a manner that one example embodiment is a modified example, an application example, a detailed example, or a supplementary example of a part or the whole of another example embodiment. Further, in the following example embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used. For example, a plurality of quantum chips and a plurality of interposers may be formed.

Further, in the following example embodiments, the components (including operation steps and the like) are not necessarily indispensable except for cases where the component is explicitly specified or the component is obviously indispensable based on its principle. Similarly, in the following example embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

In the following, quantum computing refers to the field of utilizing quantum mechanical phenomena (quantum bits) to manipulate data. These quantum mechanical phenomena include superposition of a plurality of states (in which a quantum variable simultaneously exists in multiple different states) and entanglement (a state in which multiple quantum variables have related states irrespective of space or time). A quantum circuit that generates quantum bits is provided in a quantum chip.

<Study in Advance by Inventors>

Prior to giving the description of a quantum device 100 according to a first example embodiment, contents studied in advance by the inventors will be described.

Figure 6:
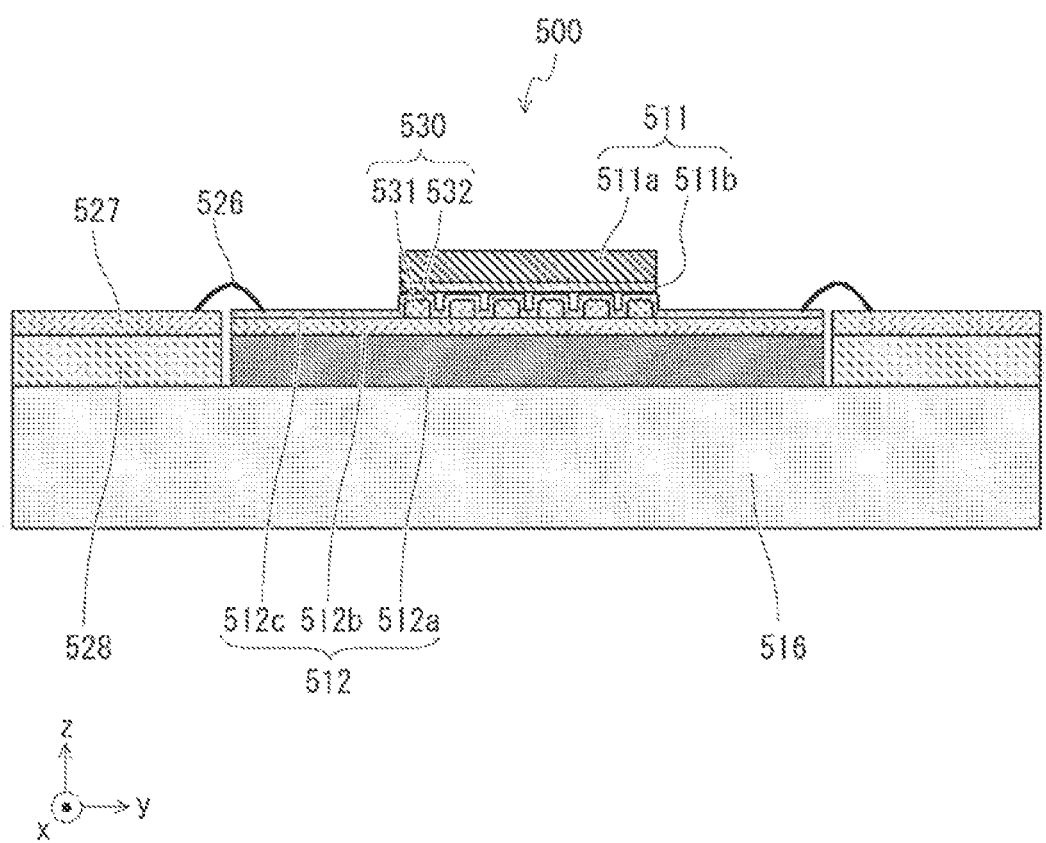
FIG. 6 is a schematic cross-sectional view of a quantum device in a conceptual stage.

FIG. 6 is a schematic cross-sectional view of a quantum device 500 in a conceptual stage before reaching the first example embodiment. The quantum device 500 is mounted on a quantum computer device and placed in a cryogenic environment, whereby operations that utilize superconductive phenomena are achieved.

Specifically, the quantum device 500 includes a quantum chip 511, an interposer 512, a connection part 530, a sample table 516, a base substrate 528, and a bonding wire 526.

The interposer 512 and the base substrate 528 are arranged in proximity to each other on the main surface of the sample table 516. The sample table 516 includes a cooling function.

The interposer 512 includes an interposer substrate 512a, a wiring layer 512b, and a metal film 512c. The wiring layer 512b is formed on one main surface (the surface that is opposite to the surface that contacts the sample table 516) of the interposer substrate 512a (hereinafter it may also be simply referred to as an interposer 512), and the metal film 512c is further formed on the surface of the wiring layer 512b as a part of the wiring layer 512b.

The wiring layer 512b is formed of one of a superconducting material and a normal conducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. The normal conducting material is, for example, a metallic material such as copper (Cu), silver (Ag), gold (Au), platinum (Pt), and an alloy including any of them. In this example, a case in which the wiring layer 512b is made of Cu, which is a normal conducting material, will be described.

Further, the metal film 512c is formed of a superconducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. In this example, a case in which the metal film 512c is made of Nb will be described.

The quantum chip 511 includes a quantum chip body 511a and a wiring layer 511b. The wiring layer 511b is formed on one main surface of the quantum chip body 511a (hereinafter it may also be simply referred to as a quantum chip 511). The wiring layer 511b of the quantum chip 511 is formed of a superconducting material. In this example, a case in which the wiring layer 511b is made of Nb will be described.

The quantum chip 511 and the interposer 512 are arranged in such a way that the wiring layers thereof are opposed to each other.

The connection part 530 is provided between the quantum chip 511 and the interposer 512 and electrically connects the wiring layer 511b of the quantum chip 511 to the wiring layer 512b of the interposer 512. Accordingly, signals can be transferred between the quantum chip 511 and the interposer 512. Non-contact signal transfer may also be performed between the quantum chip 511 and the interposer 512.

Specifically, the connection part 530 includes a plurality of pillars 531 and a metal film 532. The plurality of pillars 531 are formed so as to be protruded from one main surface of the interposer 512. The metal film 532 is formed on the surface of the plurality of pillars 531. The metal film 532 is formed on the surface of the plurality of pillars 531 so as to be continuous with the metal film 512c formed on the surface of the wiring layer 512b of the interposer 512.

Note that the plurality of pillars 531 are made of a normal conducting material. In this example, a case in which the plurality of pillars 531 are made of Cu will be described. Further, the metal film 532 is formed of a superconducting material, just like the metal film 512c. In this example, a case in which the metal film 532 is made of Nb will be described.

The wiring layer 512b of the interposer 512 (including the metal film 512c) and a wiring layer 527 of the base substrate 528 are connected to each other via the bonding wire 526. Accordingly, signal lines (terminals) of the quantum chip 511 are externally drawn out via the interposer 512 and the bonding wire 526.

Further, heat in the quantum chip 511 is dissipated to the sample table 516 having a cooling function via the interposer 512. Accordingly, the quantum device 500 is maintained in a cryogenic state where superconducting phenomena can be utilized.

In the quantum device 500, the other main surface of the interposer 512 is covered with the sample table 516. Therefore, the signal lines (terminals) of the quantum chip 511 can be drawn out only from an area of one main surface of the interposer 512 other than the area where the quantum chip 511 is mounted. That is, in the quantum device 500, the number of terminals that can be externally drawn out from the quantum chip 511 is small.

In order to solve the above problem, a quantum device 100 according to a first example embodiment capable of increasing the number of terminals that can be externally drawn out without impairing the cooling performance has been made.

First Example Embodiment

Figure 2:
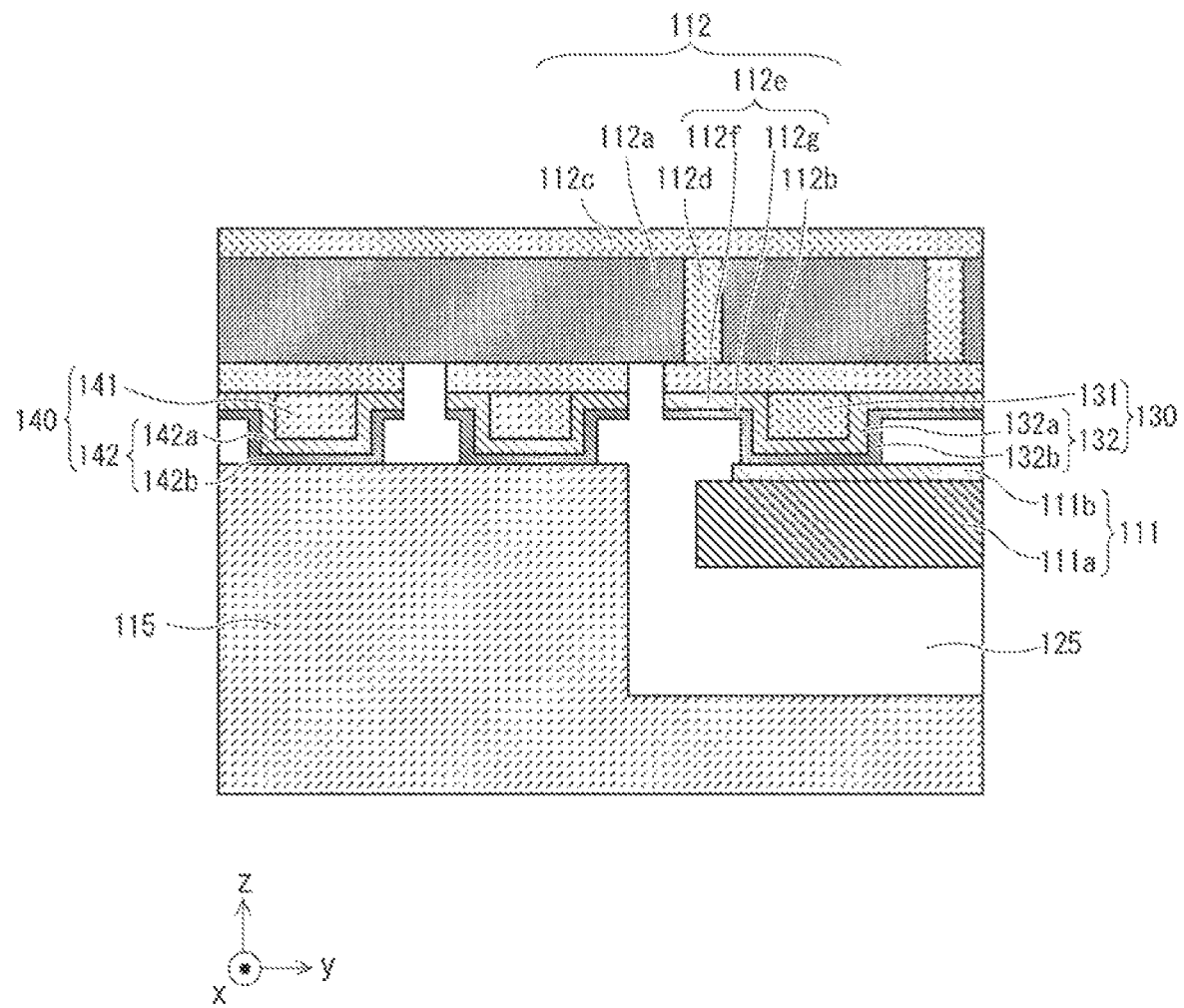
FIG. 2 is a schematic cross-sectional view in which a part of the quantum device shown in FIG. 1 is enlarged.
Figure 3:
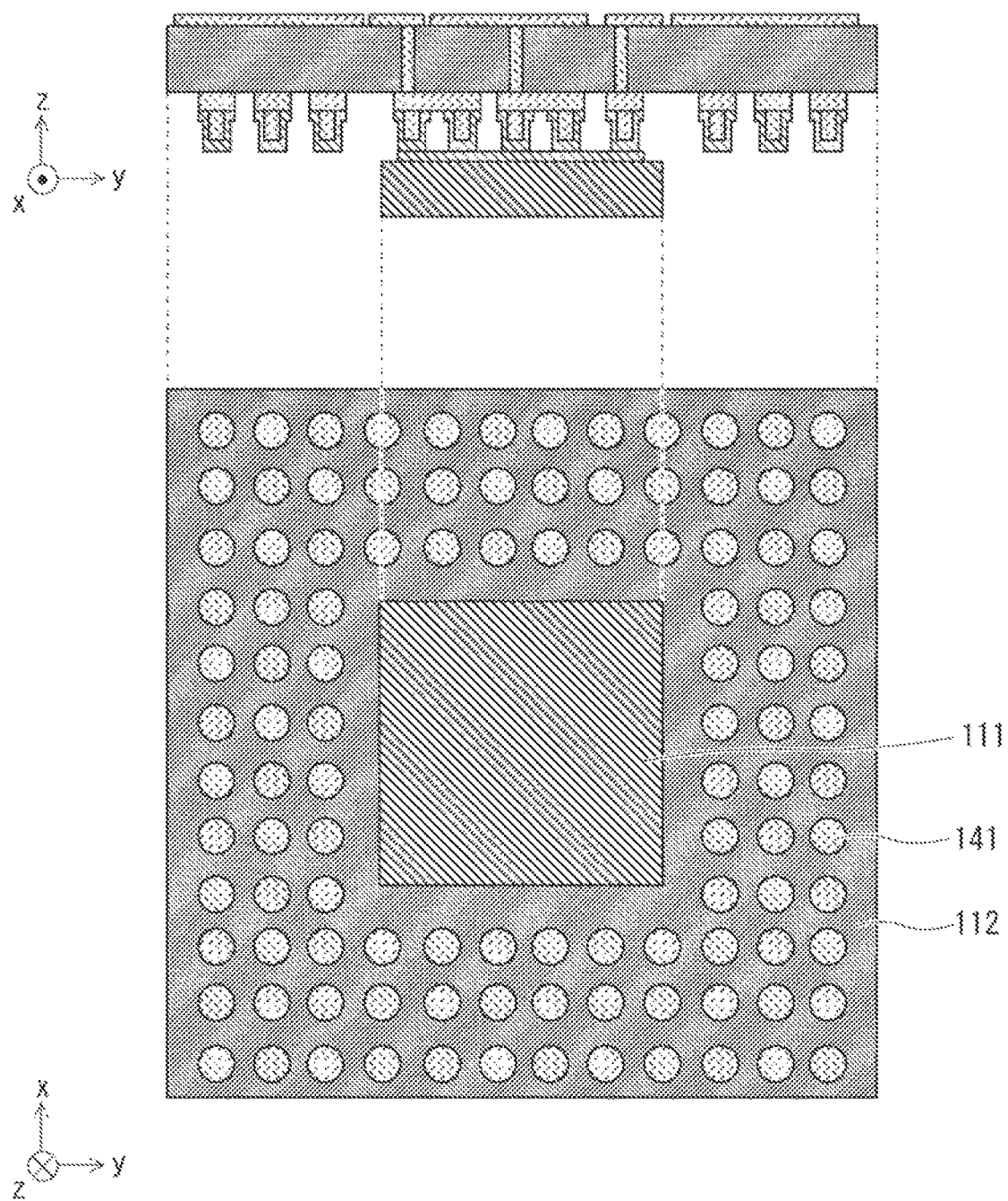
FIG. 3 is a schematic plan view of a quantum chip, an interposer, and a dummy pillar provided in the quantum device shown in FIG. 1.

FIG. 1 is a schematic cross-sectional view of a quantum device 100 according to a first example embodiment. FIG. 2 is a partially enlarged schematic cross-sectional view of an area A1 of the quantum device 100 shown in FIG. 1. Further, FIG. 3 is a schematic plan view of a quantum chip, an interposer, and dummy pillars provided in the quantum device 100 shown in FIG. 1. The quantum device 100 is mounted on a quantum computer device and is placed in a cryogenic environment, whereby operations that utilize superconducting phenomena are achieved.

Specifically, the quantum device 100 includes a quantum chip 111, an interposer 112, a first connection part 130, a second connection part 140, a cooling plate 115, a sample table 116, a metal foil 117, a probe head 118, probe pins 119, a probe card 120, fixing screws 121, and plugs 122.

The sample table 116 includes a recessed part at the center of its main surface (upper surface) and the cooling plate 115 is fit into this recessed part via the metal foil 117 having a ductility such as In. Now, alignment pins 116b are provided in the recessed part of the sample table 116 and holes 115b that correspond to the alignment pins 116b are provided on the bottom surface of the cooling plate 115. Accordingly, the cooling plate 115 can be accurately arranged inside the recessed part of the sample table 116. Note that the sample table 116 is preferably made of copper (Cu), an alloy including copper, or aluminum (Al) in view of heat conduction. When the sample table 116 is made of aluminum, it may be insulated by alumite treatment.

The cooling plate 115 includes a recessed part at the center of its main surface (upper surface) and the quantum chip 111 is arranged inside each recessed part with gaps therebetween. Further, alignment holes 115a used when the quantum chip 111 is arranged inside the recessed part of the cooling plate 115 are provided on the main surface of the cooling plate 115. Accordingly, the quantum chip 111 can be accurately arranged inside the recessed part of the cooling plate 115. Further, holes 115c that correspond to alignment pins 118c provided in the probe head 118 are provided on the main surface of the cooling plate 115. Accordingly, the probe head 118 can be accurately arranged in the cooling plate 115 and the sample table 116.

The interposer 112 includes an interposer substrate 112a, a wiring layer 112b, a wiring layer 112c, a Through Via (TV) 112d, and a metal film 112e. The wiring layer 112b is formed on one main surface (the surface where the quantum chip 111 is arranged) of the interposer substrate 112a (hereinafter it may also be simply referred to as an interposer 112) and a metal film 112e is further formed as a part of the wiring layer 112b on the surface of the wiring layer 112b. The wiring layer 112c is formed on the other main surface of the interposer substrate 112a. The wiring layers 112b and 112c are electrically connected to each other via the TV 112d formed inside the interposer substrate 112a. The interposer 112 includes, for example, silicon (Si). Note that the interposer 112 is not limited to the one that includes silicon as long as the quantum chip 111 can be mounted thereon and may include another electronic material such as sapphire, a compound semiconductor material (group IV, group III-V, group II-VI), glass, or ceramic. The surface of the interposer substrate 112a is preferably covered with a silicon oxide film (SiO2, TEOS film or the like). Further, when silicon is used, a Through Silicon Via (TSV) is used as the TV 112d.

The wiring layers 112b and 112c, and the TV 112d are each formed of one of a superconducting material and a normal conducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. The normal conducting material is, for example, a metallic material such as copper (Cu), silver (Ag), gold (Au), platinum (Pt), and an alloy including any of them. In this example, a case in which the wiring layers 112b and 112c, and the TV 112d are all made of Cu, which is a normal conducting material, will be described.

Further, the metal film 112e includes a single-layer structure or a multi-layer structure and at least one layer is made of a superconducting material. The superconducting material is, for example, a metallic material such as niobium (Nb), niobium nitride (NbN), aluminum (Al), indium (In), lead (Pb), tin (Sn), rhenium (Re), palladium (Pd), titanium (Ti), titanium nitride (TiN), tantalum (Ta), and an alloy including any of them. In this example, a case in which the metal film 112e includes a two-layer structure, the bottom layer 112f that contacts the wiring layer 112b is made of Nb and the top layer 112g is made of In will be described. Note that a Ti layer or a TiN layer may be further provided between the Nb layer 112f and the In layer 112g in order to improve adhesiveness therebetween.

The quantum chip 111 includes a quantum chip body 111a and a wiring layer 111b. The wiring layer 111b is formed on one main surface of the quantum chip body 111a (hereinafter it may also be simply referred to as a quantum chip 111). The quantum chip 111 includes, for example, silicon (Si). The quantum chip 111 is not limited to the one that includes silicon as long as the quantum chip 111 is able to form quantum bits, and may include another electronic material such as sapphire or a compound semiconductor material (group IV, group III-V, group II-VI). Further, while the quantum chip 111 is preferably a monocrystal quantum chip, it may instead be a polycrystal or amorphous quantum chip. Further, the wiring layer 111b of the quantum chip 111 is formed of a superconducting material. In this example, a case in which the wiring layer 111b is made of Nb will be described.

The quantum chip 111 and the interposer 112 are arranged in such a way that the wiring layers 111b and 112b thereof are opposed to each other.

The first connection part 130 is provided between the quantum chip 111 and the interposer 112 and electrically connects the wiring layer 111b of the quantum chip 111 to the wiring layer 112b of the interposer 112. Accordingly, signals can be transferred between the quantum chip 111 and the interposer 112. Non-contact signal transfer may also be performed between the quantum chip 111 and the interposer 112.

Specifically, the first connection part 130 includes a plurality of pillars 131 and a metal film 132. The plurality of pillars 131 are formed (arranged) in such a way that they are protruded from one main surface of the interposer 112 (the surface where the quantum chip 111 is provided) to an area where the quantum chip 111 is mounted. The metal film 132 is formed (arranged) on the surface of the plurality of pillars 131 in such a way that the metal film 132 is continuous with the metal film 112e formed on a surface of the wiring layer 112b of the interposer 112.

The plurality of pillars 131 are formed of one of a superconducting material and a normal conducting material. In order to enhance the cooling performance, for example, they are preferably formed of a normal conducting material. In this example, a case in which the plurality of pillars 131 are made of Cu, which is a normal conducting material, will be described. Further, the metal film 132 is made of a metallic material including a superconducting material, just like the metal film 112e. That is, in this example, a case in which the metal film 132 includes a two-layer structure, the bottom layer 132a is made of Nb, and the top layer 132b that contacts the wiring layer 111b of the quantum chip 111 is made of In will be described. A Ti layer or a TiN layer may be further provided between the Nb layer 132a and the In layer 132b in order to improve adhesiveness therebetween.

The second connection part 140 is provided between the cooling plate 115 and the interposer 112 and connects the cooling plate 115 to the interposer 112. Accordingly, heat in the quantum chip 111 is dissipated to the sample table 116 via the second connection part 140, the cooling plate 115, and the metal foil 117. Accordingly, the quantum device 100 is maintained in a cryogenic state where superconducting phenomena can be utilized.

Specifically, the second connection part 140 includes a plurality of dummy pillars 141 and a metal film 142. The plurality of dummy pillars 141 are formed to be protruded from a peripheral area of one main surface of the interposer 112 (the surface where the quantum chip 111 is arranged) that surrounds the area where the plurality of pillars 131 are formed. The metal film 142 is formed on a surface of the plurality of dummy pillars 141. In this example, the second connection part 140 is formed so as to be electrically independent from the first connection part 130.

The plurality of dummy pillars 141 are formed of one of a superconducting material and a normal conducting material, like the plurality of pillars 131. In order to improve the cooling performance, for example, the plurality of dummy pillars 141 are preferably formed of a normal conducting material. In this example, a case in which the plurality of dummy pillars 141 are made of Cu, which is a normal conducting material, just like the plurality of pillars 131, will be described. Further, the metal film 142 is formed of a metallic material including a superconducting material, just like the metal film 132. When the metal film 142 is a multilayer structure, the top layer is preferably formed of a metallic material having a ductility higher than those of the other layers. Accordingly, adhesiveness between the cooling plate 115 and the interposer 112 is improved (the size of the bonding area can be efficiently increased following the irregularities of the bonded surface), whereby heat in the quantum chip 111 can be dissipated to the cooling plate more efficiently. In this example, a case in which the metal film 142 includes a two-layer structure, just like the metal film 132, the bottom layer 142a is made of Nb, and the top layer 142b that contacts the cooling plate 115 is made of In will be described. Note that a Ti layer or a TiN layer may be further provided between the Nb layer 142a and the In layer 142b in order to improve adhesiveness therebetween.

The probe head 118 is arranged on the sample table 116 and the cooling plate 115 and the probe card 120 is further arranged on the probe head 118. The alignment pins 118c are provided in the probe head 118 and the holes 115c that correspond to the alignment pins 118c are provided in the cooling plate 115. Accordingly, the probe head 118 can be accurately arranged in the cooling plate 115. Further, they are fixed to the sample table 116 by fixing screws 121. Therefore, desired positions of the wiring layer 112c of the interposer 112 can be accurately touched with the probe pins 119. Further, the plugs 122 are arranged on the probe card 120.

The probe head 118 has a recessed part on its bottom surface and the interposer 112 is arranged in the recessed part thereof. That is, the quantum chip 111 and the interposer 112 are arranged in a space region 125 formed of the recessed part of the probe head 118 and the recessed part of the cooling plate 115. This space region 125 is preferably in a vacuum state. Accordingly, the heat insulation property is improved, whereby heat transfer from the interposer 112 to the quantum chip 111 can be, for example, prevented.

The plurality of probe pins 119 are provided between the interposer 112 and the probe card 120 and electrically connect the wiring layer 112c formed on the other surface of the interposer 112 (the surface that is opposite to the surface where the quantum chip 111 is provided) to the probe card 120. Accordingly, signal lines (terminals) of the quantum chip 111 are externally drawn out via the interposer 112, the probe pins 119, the probe card 120, and the plugs 122.

Next, a method of manufacturing the quantum device 100 will be partly described. First, the first connection part 130 and the second connection part 140 are formed on one main surface of the interposer 112. After that, the quantum chip 111 is arranged on one main surface of the interposer 112 in such a way that the wiring layer 111b of the quantum chip 111 contacts the first connection part 130. After that, the interposer 112 is arranged on the cooling plate 115 (in other words, the cooling plate 115 is arranged on one main surface of the interposer 112) in such a way that the cooling plate 115 contacts the second connection part 140. At this time, by using the holes 115a provided in the cooling plate 115 as recognition marks, the interposer 112 can be arranged in the cooling plate 115 with a high accuracy.

As described above, in the quantum device 100 according to this example embodiment, the quantum chip 111 is arranged on one main surface of the interposer 112 via the first connection part 130 and the cooling plate 115 is arranged via the second connection part 140. Further, in the quantum device 100 according to this example embodiment, the signal lines (terminals) of the quantum chip 111 are drawn out from the whole surface of the other main surface of the interposer 112. Accordingly, the quantum device 100 according to this example embodiment is able to increase the number of terminals that can be externally drawn out without impairing the cooling performance.

While the case in which the wiring layer 112b of the interposer 112 is made of a normal conducting material and the metal film 112e formed on its surface is made of a superconducting material has been described in this example embodiment, this is merely one example. The wiring layer 112b of the interposer 112 may be formed of a superconducting material such as Nb. In this case, the metal film 112e may not be formed on the surface of the wiring layer 112b. Further, in this case, for example, the wiring layer 112b of the interposer 112, and the metal films 132 and 142 respectively formed on the surfaces of the plurality of pillars 131 and the plurality of dummy pillars 141 are formed so as to be continuous with each other.

(Modified Example of Quantum Device 100)

Figure 4:
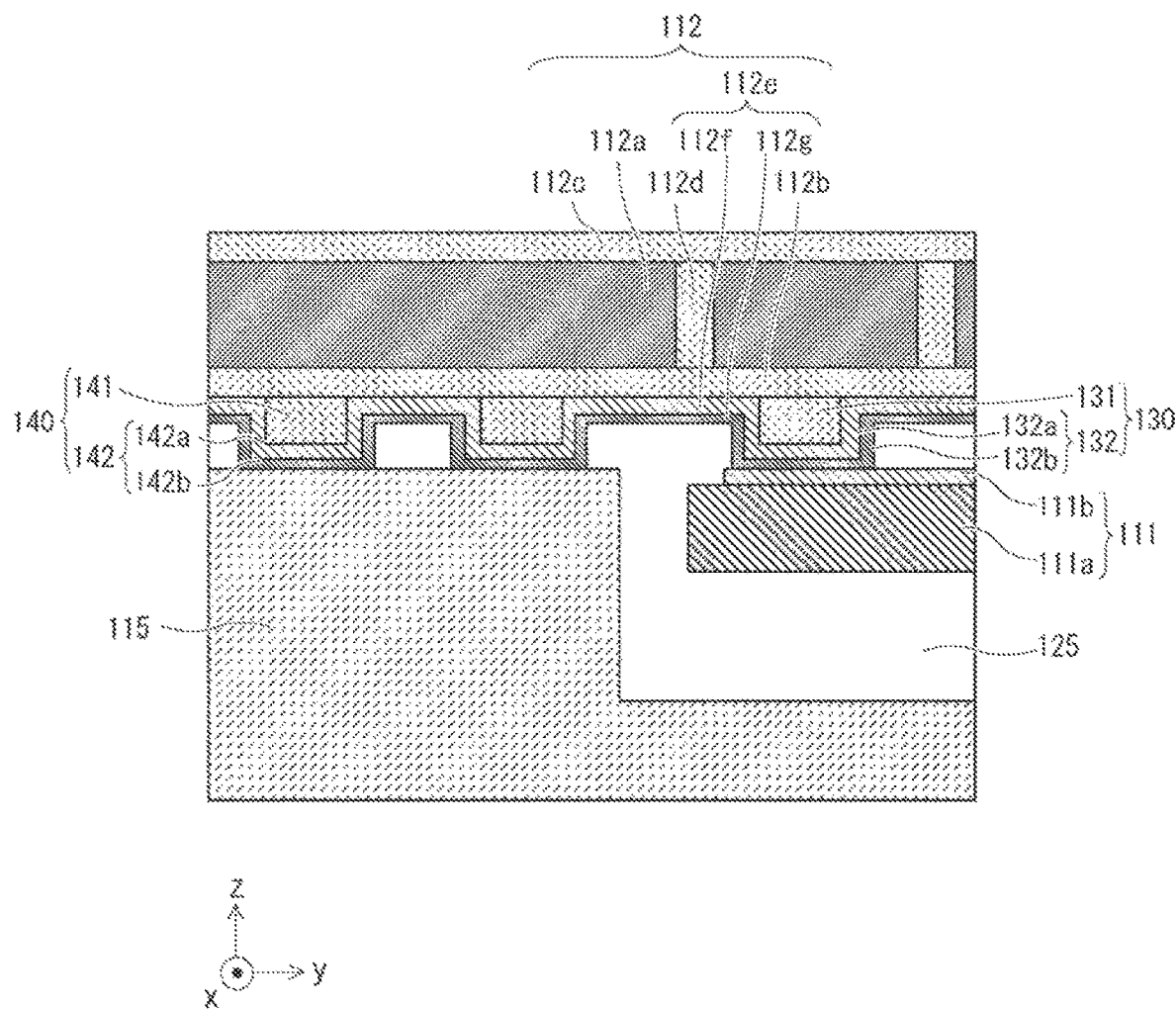
FIG. 4 is a partially enlarged schematic cross-sectional view of a modified example of the quantum device shown in FIG. 1.

FIG. 4 is a partially enlarged schematic cross-sectional view of a part of a quantum device 100a, which is a modified example of the quantum device 100. As shown in FIG. 4, the quantum device 100a is different from the quantum device 100 in that a metal film 132 formed on a surface of a plurality of pillars 131 and a metal film 142 formed on a surface of a plurality of dummy pillars 141 are formed so as to be continuous with each other via a metal film 112e in the quantum device 100a. In other words, a first connection part 130 and a second connection part 140 are connected to a common electrode (e.g., a ground electrode). Since the other configurations of the quantum device 100a are similar to those of the quantum device 100, the descriptions thereof will be omitted.

In the quantum device 100a, the first connection part 130 and the second connection part 140 are connected to the common electrode (e.g., the ground electrode), whereby a path through which heat in the quantum chip 111 is dissipated via the first connection part 130, the metal film 132 (142), the second connection part 140, and the cooling plate 115 is formed. As a result, heat in the quantum chip 111 can be dissipated to the cooling plate 115 more efficiently.

Second Example Embodiment

Figure 5:
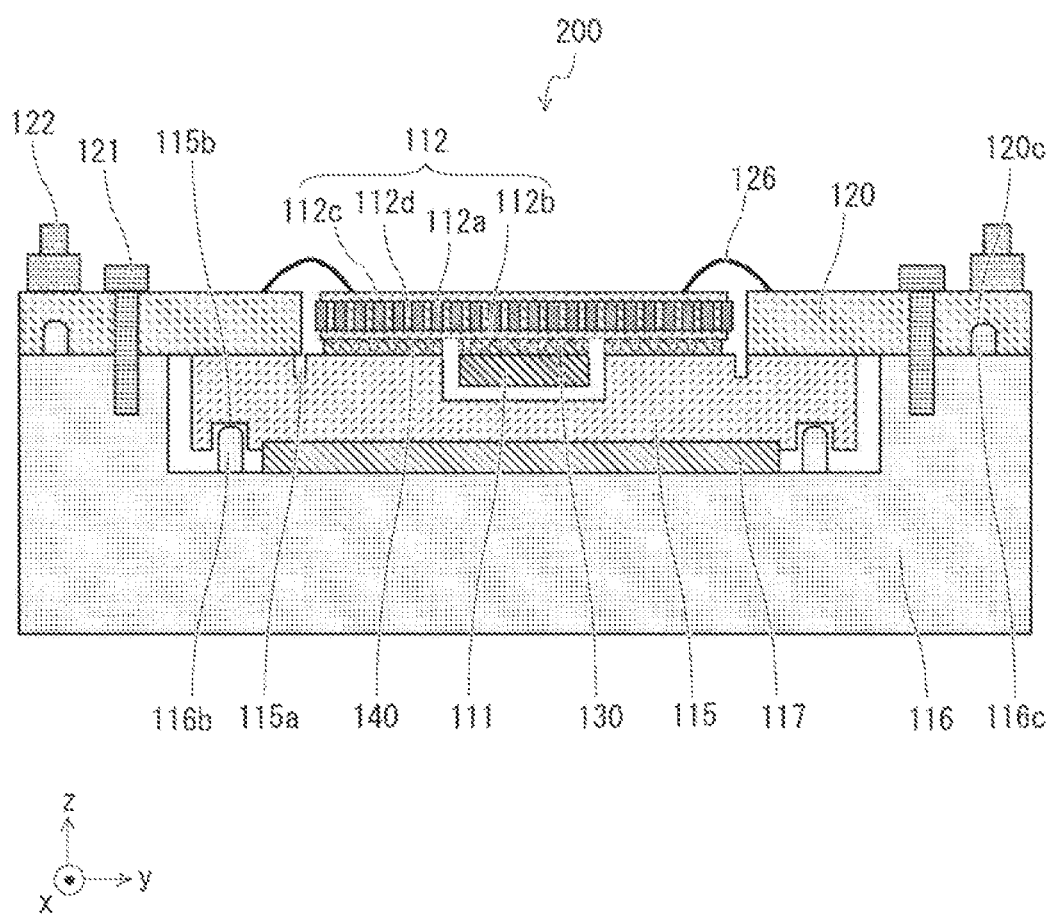
FIG. 5 is a schematic cross-sectional view of a quantum device according to a second example embodiment.

FIG. 5 is a schematic cross-sectional view of a quantum device 200 according to a second example embodiment. The quantum device 200 is different from the quantum device 100 in that the quantum device 200 includes a bonding wire 126 in place of the probe head 118 and the probe pins 119.

Specifically, as shown in FIG. 5, a probe card 120 is directly arranged on a sample table 116 and a cooling plate 115. The probe card 120 is fixed to the sample table 116 by fixing screws 121. Terminals formed on the probe card 120 and terminals formed on the other main surface (the surface that is opposite to the surface where the quantum chip 111 is provided) of the interposer 112 are connected to each other by the bonding wire 126. Accordingly, the signal lines (terminals) of the quantum chip 111 are externally drawn out via an interposer 112, the bonding wire 126, the probe card 120, and plugs 122.

Note that alignment pins 116c that correspond to holes 120c provided on the bottom surface of the probe card 120 are provided on the main surface of the sample table 116. Accordingly, the probe card 120 can be accurately arranged in the cooling plate 115 and the sample table 116. Since the other configurations of the quantum device 200 are similar to those of the quantum device 100, the descriptions thereof will be omitted.

As described above, the quantum device 200 according to this example embodiment is able to achieve effects similar to those of the quantum device 100. Specifically, the quantum device 200 according to this example embodiment is able to increase the number of terminals that can be externally drawn out without impairing the cooling performance. Further, the structure of the quantum device 200 according to this example embodiment can be made simpler than that of the quantum device 100. Accordingly, it is expected that the cooling efficiency will be improved.

While the example embodiments of the present disclosure have been described in detail with reference to the drawings, the specific configurations are not limited to the aforementioned ones and various design changes may be made without departing from the spirit of the present disclosure.

While the case in which the wiring layer 111b of the quantum chip 111 is made of Nb, the metal films of the connection parts 130 and 140 include a two-layer structure, the bottom layer is made of Nb, and the top layer is made of In has been described in the first and second example embodiments, this is merely one example. As already described above, a Ti layer or a TiN layer may be further provided between the Nb layer 132a and the In layer 132b and between the Nb layer 142a and the In layer 142b in order to improve adhesiveness therebetween. Alternatively, the wiring layer 111b of the quantum chip 111 may be made of Nb and the metal films of the connection parts 130 and 140 may include a single-layer structure made of Nb or the like. The same is applied also to the metal film 112e formed on the surface of the wiring layer 112b.

For example, the wiring layer 111b of the quantum chip 111 may be made of Al and a layer made of Ti or TiN may be further arranged in a part where the connection part 130 is arranged. Further, the metal films of the connection parts 130 and 140 may include a three-layer structure, which may be made of Al, Ti (or TiN), In or an alloy including the same in order from the bottom layer to the top layer. Note that Sn, Pb, or an alloy including any one of them may be used in place of In or an alloy including the same. The Ti layer or the TiN layer is provided so as to prevent alloying of Al and In. The same is applied also to the metal film 112e formed on the surface of the wiring layer 112b.

Alternatively, the wiring layer 111b of the quantum chip 111 may be made of Ta, the metal films of the connection parts 130 and 140 may include a two-layer structure, the bottom layer may be made of Ta, and the top layer may be made of In, Sn, Pb, or an alloy including any one of them. The same is applied also to the metal film 112e formed on the surface of the wiring layer 112b.

According to the example embodiment, it is possible to provide a quantum device and a method of manufacturing the same capable of increasing the number of terminals that can be externally drawn out without impairing the cooling performance.

The first and second embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

The whole or part of the exemplary embodiments disclosed above can be described as, but not limited to, the following supplementary notes.

(Supplementary Note 1)

A quantum device comprising:
an interposer;
a quantum chip;
a first connection part that is provided between the interposer and the quantum chip and electrically connects a wiring layer of the interposer to a wiring layer of the quantum chip; and
a second connection part that is provided on a main surface of the interposer where the first connection part is arranged and is connected to a cooling plate.

(Supplementary Note 2)

The quantum device according to Supplementary Note 1, wherein the second connection part is provided electrically independently from the first connection part.

(Supplementary Note 3)

The quantum device according to Supplementary Note 2, wherein
the second connection part comprises:
a plurality of dummy pillars provided on the main surface of the interposer; and
a metal film that is provided on a surface of the plurality of dummy pillars and is formed of a superconducting material.

(Supplementary Note 4)

The quantum device according to Supplementary Note 3, wherein the metal film includes a multilayer structure, at least one layer being formed of a superconducting material.

(Supplementary Note 5)

The quantum device according to Supplementary Note 3 or 4, wherein the metal film has a top layer formed of a metallic material having a ductility higher than those of the other layers.

(Supplementary Note 6)

The quantum device according to Supplementary Note 1, wherein the second connection part as well as the first connection part is connected to a ground electrode of the quantum chip.

(Supplementary Note 7)

The quantum device according to Supplementary Note 6, wherein
the first connection part comprises:
a plurality of pillars provided on the main surface of the interposer; and
a metal film that is provided on a surface of the plurality of pillars and is formed of a superconducting material,
the second connection part comprises:
a plurality of dummy pillars provided on the main surface of the interposer along with the plurality of pillars; and
the metal film provided on a surface of the plurality of dummy pillars so as to be continuous from a surface of the plurality of pillars.

(Supplementary Note 8)

The quantum device according to Supplementary Note 7, wherein the metal film includes a multilayer structure, at least one layer being formed of a superconducting material.

(Supplementary Note 9)

The quantum device according to Supplementary Note 7 or 8, wherein the metal film has a top layer formed of a metallic material having a ductility higher than those of the other layers.

(Supplementary Note 10)

The quantum device according to any one of Supplementary Notes 1 to 9, further comprising the cooling plate.

(Supplementary Note 11)

The quantum device according to any one of Supplementary Notes 1 to 10, further comprising:
- an external terminal that is formed on a main surface other than the main surface of the interposer and is electrically connected to the first connection part via a Through Via (TV) provided inside the interposer;
- a probe card; and
- one of a probe pin and a bonding wire configured to connect the external terminal of the interposer and the probe card.

(Supplementary Note 12)

A method of manufacturing a quantum device, the method comprising:
- providing a first connection part and a second connection part on one main surface of an interposer;
- arranging a quantum chip on one main surface of the interposer in such a way that a wiring layer of the quantum chip contacts the first connection part; and
- arranging a cooling plate on one main surface of the interposer in such a way that the cooling plate contacts the second connection part.

What is claimed is:

1. A quantum device comprising:
    an interposer;
    a quantum chip;
    a first connection part that is provided between the interposer and the quantum chip and electrically connects a wiring layer of the interposer to a wiring layer of the quantum chip; and
    a second connection part that is provided on a main surface of the interposer where the second connection part is arranged and is connected to a cooling plate, wherein
    the second connection part is provided electrically independently from the first connection part, and
    the second connection part comprises:
        a plurality of dummy pillars provided on the main surface of the interposer; and
        a metal film that is provided on a surface of the plurality of dummy pillars and is formed of a superconducting material.

2. The quantum device according to claim 1, wherein the metal film includes a multilayer structure, at least one layer being formed of a superconducting material.

3. The quantum device according to claim 1, wherein the metal film has a top layer formed of a metallic material having a ductility higher than those of other layers.

4. A quantum device comprising:
    an interposer;
    a quantum chip;
    a first connection part that is provided between the interposer and the quantum chip and electrically connects a wiring layer of the interposer to a wiring layer of the quantum chip; and
    a second connection part that is provided on a main surface of the interposer where the first connection part is arranged and is connected to a cooling plate, wherein
    the second connection part as well as the first connection part is connected to a ground electrode of the quantum chip,
    the first connection part comprises:
        a plurality of pillars provided on the main surface of the interposer; and
        a first metal film that is provided on a surface of the plurality of pillars and is formed of a superconducting material, and
    the second connection part comprises:
        a plurality of dummy pillars provided on the main surface of the interposer along with the plurality of pillars; and
        a second metal film provided on a surface of the plurality of dummy pillars so as to be continuous from a surface of the plurality of pillars.

5. The quantum device according to claim 4, wherein the each of the first and the second metal films includes a multilayer structure, at least one layer being formed of a superconducting material.

6. The quantum device according to claim 4, wherein the each of the first and the second metal films has a top layer formed of a metallic material having a ductility higher than those of the other layers.

\* \* \* \* \*